United States Patent
Hayashi et al.

(10) Patent No.: US 6,288,326 B1
(45) Date of Patent: Sep. 11, 2001

(54) PHOTOVOLTAIC MODULE

(75) Inventors: Akimine Hayashi; Naoaki Nakanishi, both of Kobe; Seishiro Mizukami, Kyoto; Takeharu Yamawaki, Shiga, all of (JP)

(73) Assignee: Kaneka Corporation, Osaka (JP)

( * ) Notice: Subject to any disclaimer, the term of this patent is extended or adjusted under 35 U.S.C. 154(b) by 0 days.

(21) Appl. No.: 09/531,545

(22) Filed: Mar. 20, 2000

(30) Foreign Application Priority Data

| Mar. 23, 1999 | (JP) | 11-077910 |
| Aug. 13, 1999 | (JP) | 11-229211 |
| Aug. 13, 1999 | (JP) | 11-229213 |
| Nov. 19, 1999 | (JP) | 11-330138 |
| Nov. 19, 1999 | (JP) | 11-330140 |

(51) Int. Cl.$^7$ ............................................. H01L 31/042
(52) U.S. Cl. .................. 136/251; 136/244; 136/293; 257/433; 438/64; 438/66; 438/80; 438/67; 156/267; 156/300; 156/309.3; 156/309.6; 156/309.9
(58) Field of Search .................. 136/244, 251, 136/293; 257/433; 438/64, 66, 80, 67; 156/267, 300, 309.3, 309.6, 309.9

(56) References Cited

U.S. PATENT DOCUMENTS

| 4,067,764 | * | 1/1978 | Walker et al. | 136/251 |
| 4,636,578 | * | 1/1987 | Feinberg | 136/251 |
| 5,252,141 | * | 10/1993 | Inoue et al. | 136/251 |
| 5,507,880 | * | 4/1996 | Ishikawa et al. | 136/251 |
| 5,578,142 | * | 11/1996 | Hattori et al. | 136/251 |
| 5,733,382 | * | 3/1998 | Hanoka | 136/251 |
| 5,782,994 | * | 7/1998 | Mori et al. | 136/251 |

FOREIGN PATENT DOCUMENTS

| 58-17685 | 2/1983 | (JP) . |
| 62-152183 | 7/1987 | (JP) . |
| 63-147377 | 6/1988 | (JP) . |
| 63-249381 | 10/1988 | (JP) . |
| 2-21670 | 1/1990 | (JP) . |
| 4-101465 | 4/1992 | (JP) . |
| 6-151936 | 5/1994 | (JP) . |
| 6-310748 | 11/1994 | (JP) . |
| 9-116180 | 5/1997 | (JP) . |

OTHER PUBLICATIONS

Minning et al, "Thermal and optical performance of encapsulation systems for flat plate photovoltaic modules," Conference Record, 15th IEEE Photovoltaic Specialists Conference, Kissimmee, FL, May 12–15, 1981, published Aug. 1981.*

* cited by examiner

*Primary Examiner*—Alan Diamond
(74) *Attorney, Agent, or Firm*—Hogan & Hartson, L.L.P.

(57) ABSTRACT

A photovoltaic module comprises a substrate, a semiconductor layer arranged on one of the principal surfaces of the substrate, divided into a plurality of sections and sealed by a encapsulation material, in that the encapsulation material is arranged on the principal surface of the substrate without its end face projecting outwardly beyond the end face of the substrate.

5 Claims, 5 Drawing Sheets

PHOTOVOLTAIC MODULE

CROSS-REFERENCE TO RELATED APPLICATIONS

This application is based upon and claims the benefit of priority from the prior Japanese Patent Application No. 11-077910, filed Mar. 23, 1999; No. 11-229211, filed Aug. 13, 1999; No. 11-229213, filed Aug. 13, 1999; No. 11-330138, filed Nov. 19, 1999; and No. 11-330140, filed Nov. 19, 1999, the entire contents of which are incorporated herein by reference.

BACKGROUND OF THE INVENTION

This invention relates to a photovoltaic module having a semiconductor layer formed on a glass substrate and sealed by means of a encapsulation material. Known photovoltaic modules include those of the crystal type prepared by using single crystal silicon or polycrystal silicon and those of the amorphous type prepared by using amorphous silicon. In any case, it has to be noted that silicon is apt to chemically react and fragile when subjected to a kinetic impact.

The use of a encapsulation structure has been proposed in order to protect the silicon in the photovoltaic module and electrically insulate the semiconductor layer of the module. According to the proposed encapsulation technique, the encapsulation structure may comprise a encapsulation material typically made of EVA (ethylene-vinyl acetate copolymer) or EVAT (ethylene-vinyl acetate-triallylisocyanurate bridged tripartite copolymer). When encapsulation the semiconductor layer with a encapsulation material, the substrate and the encapsulation material laid on the substrate are normally united by applying pressure and heat.

As the encapsulation material is heated under pressure, it contracts. Therefore, the encapsulation material is sized so as to be greater than the substrate in order to compensate the contraction by heat under pressure. However, the extent of contraction of the encapsulation material by heat under pressure can vary as a function of various factors involved in the heating/pressurizing operation. The net result can often be a peripheral edge of the encapsulation material projecting outwardly beyond its counterpart of the substrate.

When the photovoltaic module is used in a state where the peripheral edge of the encapsulation material is projecting outwardly beyond the counterpart of the substrate, external force can inadvertently be applied to the portion of the encapsulation material projecting beyond the end face of the substrate and a repeated application of such force can eventually damage the periphery of the encapsulation material to separate, at least partly, the encapsulation material from the substrate by a gap, through which rain water can get into the semiconductor layer.

FIG. 14 of the accompanying drawings schematically illustrates a known thin film type photovoltaic module designed to enhance the environment-resistance of the photovoltaic cells. The illustrated photovoltaic module is same as a module disclosed in Japanese Utility Model Application Laid-Open No. 25633877. Referring to FIG. 14, there is shown a front surface glass cover 1 operating as transparent substrate, on the rear surface of which a plurality of thin film type photovoltaic cells 2 are arranged and connected in series and/or in parallel by the rear electrode 3. The rear electrode 3 is connected to an output lead-out wire 4 typically made of metal foil. The rear electrode 3 is sealed by means of a filling member 5. More specifically, the filling member 5 is formed typically by hot-melting EVA, while keeping the related end of the output lead-out wire 4 standing. The rear surface of the filling member 5 is coated with a rear surface encapsulation material (weather-resistant film) 6 having a three-layered structure of sandwiching a metal foil 6a by a pair of insulating films 6b. The rear surface filling member 6 is provided with a through bore operating as an output lead-out section Q for leading the output lead-out wire 4 to the outside. The output lead-out wire 4 is drawn to the rear surface side of the rear surface encapsulation material 6 by way of the through bore. The output lead-out wire 4 drawn to the outside is secured at the leading end thereof to terminal 7 by soldering or by means of a screw. An output lead wire 8 is connected to the terminal 7. The terminal section including the output lead-out wire 4, the terminal 7 and the output lead wire 8 is housed in a terminal box 9.

The exposed areas of the filling member 5 and the output lead-out wire 4 of the output lead-out section Q may be sealed by means of protective resin such as silicon resin. Similarly, the surface of the terminal 8 may be sealed by means of protective resin such as silicon resin.

FIG. 15 of the accompanying drawings schematically illustrates a known crystal type photovoltaic module. Referring to FIG. 15, a plurality of crystal type photovoltaic cells 11 are arranged on the rear surface of a front surface glass cover 1 and connected by connection wires 12. The photovoltaic cell 11 arranged at an end of the module is connected to an output lead-out wire 4 typically made of metal foil. Otherwise, the module of FIG. 15 has a configuration substantially same as the module of FIG. 14.

Neither of the above listed photovoltaic modules is not satisfactory in terms of moisture-resistance and water-resistance because the filling member 5 is exposed to the atmosphere at the output lead-out section Q. If the output lead-out section Q is protected by means of silicon resin or some other protecting material, it not satisfactory either in terms of moisture-resistance and water-resistance because the section Q remains practically exposed to the atmosphere. Thus, particularly if water penetrates into the inside of the terminal box 9, moisture can get into the filling member 5 by way of the output lead-out section Q to consequently corrode the output lead-out wire 4 and the rear electrode 3. This is a major drawback of known photovoltaic modules particularly in terms of environment-resistance. As a matter of fact, most of the troubles that occur in photovoltaic modules are attributable to a corroded rear electrode 3 produced by moisture penetrated into it from the outside.

BRIEF SUMMARY OF THE INVENTION

In view of the above circumstances, it is therefore the object of the present invention to provide a photovoltaic module that can prevent its encapsulation material encapsulation the semiconductor layer from being damaged and its periphery from being separated from the substrate.

According to the invention, the above object is achieved by providing a photovoltaic module comprising a substrate, a semiconductor layer arranged on one of the principal surfaces of the substrate, divided into a plurality of sections and sealed by a encapsulation material, characterized in that the encapsulation material is arranged on the principal surface of the substrate without its end face projecting outwardly beyond the end face of the substrate.

According to the invention, since the end face of the encapsulation material is not projecting outwardly beyond the end face of the substrate, the encapsulation material is prevented from being subjected to inadvertently applied external force that can be applied to an end area of the encapsulation material. Particularly, when the end face of the encapsulation material is in the form of a first slope, it is less subjected to inadvertently applied external force. Similarly, when the end face of the substrate is in the form of a second slope located on the plane of the first slope of the encapsulation material, it is least subjected to inadvertent external force because the first slope and the second slope do not form any step along the boundary thereof.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
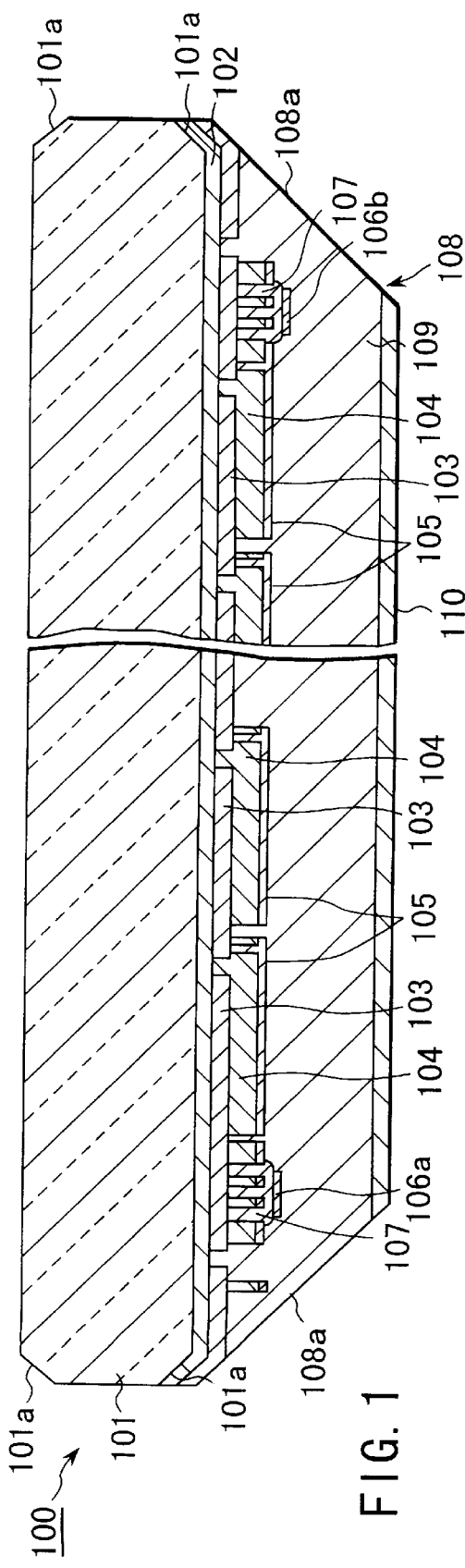
FIG. 1 is a schematic cross sectional view of the first embodiment of photovoltaic module according to the invention, from which a part thereof is removed.

FIG. 1 illustrates the first embodiment of photovoltaic module according to the invention and denoted generally by reference numeral 100. In FIG. 1, reference numeral 101 denotes a glass substrate. Both the front surface and the rear surface of the glass substrate 101 are chamfered along the edges thereof to produce chamfers (second inclined surfaces) 101a showing a predetermined angle of inclination.

Strips of transparent conductive film 103 are formed on the rear surface of the glass substrate 101 at regular intervals along the entire length of the glass substrate 101 in a predetermined direction with an $SiO_2$ film 102 interposed therebetween. While the $SiO_2$ film 102 and strips of transparent conductive film 103 are also arranged on the chamfers 102a on the rear surface of the substrate 101 in this embodiment, the chamfers 102 may be cleared of them.

Strips of semiconductor film 104 are formed on the transparent conductive film 103 at regular intervals. A rear electrode layer 105 is laid on each strip of semiconductor layer 104 to produce a multilayer structure. Every two adjacently located strips of semiconductor layer 103 are electrically connected in series by way of the transparent conductive film 103 and the rear electrode layer 105.

The strips of transparent conductive film 103 located at the opposite ends as viewed in a direction perpendicular to the said predetermined direction are provided with respective bus bars 106a, 106b that are secured to them by way of solder 107 and operate as optical lead-out electrodes. One of the bus bars, or the bus bar 106a, operates as anode, while the other bus bar 106a operates as cathode.

The semiconductor layer 104 formed on the rear surface of the glass substrate 101 is coated with a encapsulation material 108. The encapsulation material 108 comprises a resin layer 109 made of a resin material such as EVA or EVAT and a resin film layer 110 covering the resin layer 109. Although not illustrated, each of the paired bus bars 106a, 106b is lead out to the outside through the resin layer 109 and the resin film layer 110 at an end thereof. Thus, the electric output of the photovoltaic module can be obtained by way of the bus bars 106a, 106b.

The outer periphery of the encapsulation material 108 has an inclined surface (first inclined surface) 108a showing a predetermined angle of inclination. The angle of inclination of the inclined surface 108a is same as the angle of inclination of the chamfers 101a of the glass substrate 101. The chamfers 101a are unified with the inclined surface 108a.

The encapsulation material 108 is united with the glass substrate 101 as the former is bonded to the rear surface of the latter by heat under pressure. During the bonding process, the encapsulation material 108 may change its profile as it thermally contracts. Thus, the size of the encapsulation material 108 is so selected that it would not become smaller than that of the glass substrate 101 when the encapsulation material 108 thermally contracts. The inclined surface 108a of the encapsulation material 108 is formed after bonding the encapsulation material 108 to the glass substrate 101, or after the encapsulation material 108 thermally contracts. With this arrangement, the chamfers 101a of the glass substrate 101 can reliably be unified with the inclined surface 108a of the encapsulation material 108.

Thus, in a photovoltaic module 100 according to the invention, the outer peripheral surface of the encapsulation material 108 is made to have an inclined surface showing an angle of inclination same as that of the chamfers 101a of the glass substrate 101 in a manner as described above and, additionally, the chamfers 101a are unified with the inclined surface 108a.

As a result, the periphery of the encapsulation material 108 does not project outward beyond the periphery of the glass substrate 101. Thus, the encapsulation material 108 is protected against damages that can otherwise be produced when external force is inadvertently applied thereto. Then, it is prevented from being separated from the glass substrate 101 to give rise to an accident of rain water penetrating into the semiconductor layer 104.

The encapsulation material 108 of this embodiment provides not only the feature that its periphery is not projecting outwardly beyond the periphery of the glass substrate 101 but also another feature that the chamfers 101a of the glass substrate 101 are unified with the inclined surface 108a of the encapsulation material 108.

Therefore, the chamfers 101a extend from the inclined surface 108a uniformly and continuously without any step produced at the boundary thereof.

Thus, if external force is inadvertently applied to a peripheral area of the encapsulation material 108, the latter is reliably prevented from being damaged along the periphery thereof and separated from the glass substrate.

Figure 2:
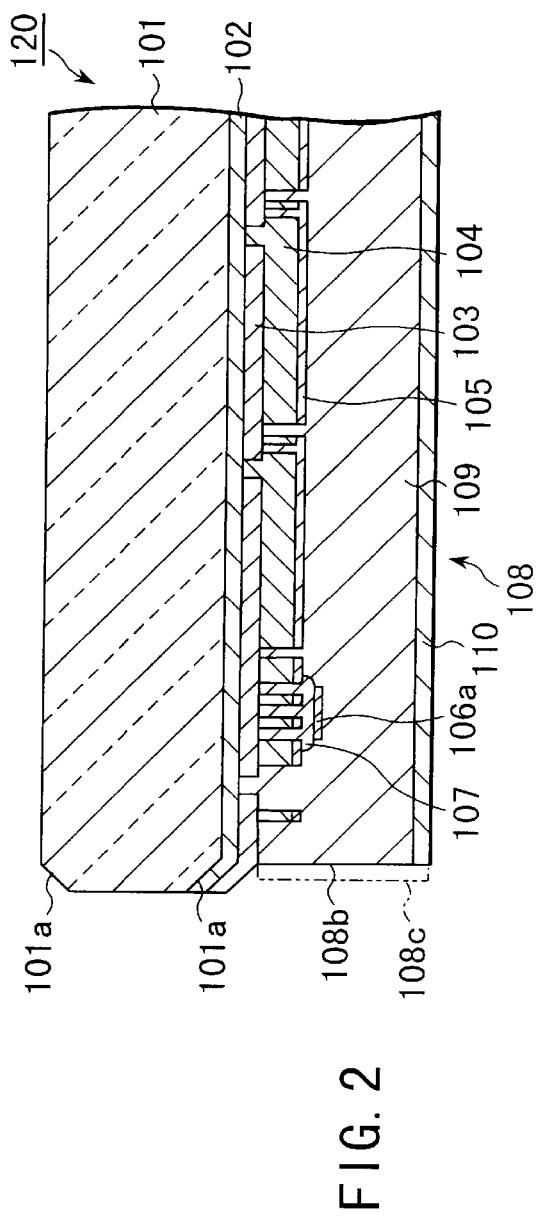
FIG. 2 is a schematic cross sectional view of the second embodiment of photovoltaic module according to the invention, showing only a part thereof.

FIG. 2 is a schematic cross sectional view of the second embodiment of photovoltaic module 120 according to the invention. Like the above described first embodiment, this second embodiment of photovoltaic module 120 comprises a glass substrate 101 also having chamfers 101a formed by chamfering the outer periphery thereof.

However, the outer peripheral surface of the encapsulation material 108 is not an inclined surface 108a but a perpendicular surface 108b standing substantially perpendicularly relative to the surface plane of the glass substrate 101. The perpendicular surface 108b is located on the rear surface of the glass substrate 101 so that it may not extend outwardly beyond the outer peripheral surface of the glass substrate 101. In this embodiment, the perpendicular surface 108b is so arranged that one of its edges positionally agree with the corresponding edges of the chamfers 101a.

With this arrangement, while the perpendicular surface 108a of the encapsulation material 108 is angularly differentiated from and hence not unified with the chamfers 101a of the glass substrate 101, the encapsulation material 108 is protected against any external force that may be inadvertently applied thereto because the encapsulation material 108 does not extends outwardly beyond the outer periphery of the glass substrate 101 as in the case of the first embodiment.

Additionally, the perpendicular surface 108b is so arranged that one of its edges positionally agree with the corresponding edges of the chamfers 101a. Therefore, the encapsulation material 108 does not extends outwardly beyond the outer periphery of the glass substrate 101 nor from the corresponding edges of the chamfers 101a unlike the imaginary perpendicular surface 108c indicated by a chained line in FIG. 2. Thus, the encapsulation material 108 is freer from the adverse effect of external force that may be inadvertently applied to the periphery thereof than that of the first embodiment.

Figure 3:
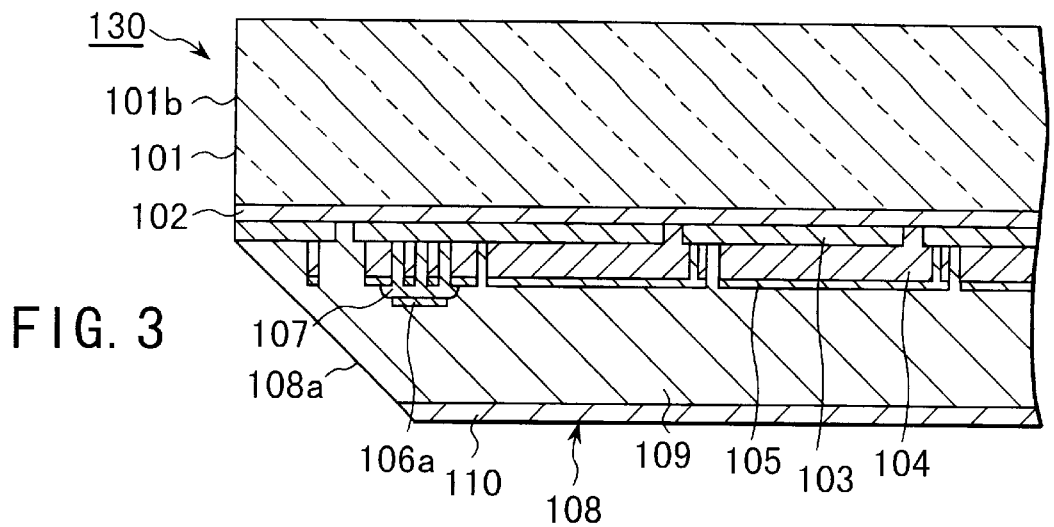
FIG. 3 is a schematic cross sectional view of the third embodiment of photovoltaic module according to the invention, showing only a part thereof.

FIG. 3 is a schematic cross sectional view of the third embodiment of photovoltaic module 130 according to the invention. The glass substrate 101 of the photovoltaic module 130 of this embodiment is not chamfered at an edge thereof and its outer peripheral surface is a perpendicular surface 101b. On the other hand, the outer peripheral surface of the encapsulation material 108 is made to be an inclined surface 108a having a predetermined angle of inclination and arranged so as not to extend outwardly beyond the perpendicular surface 101b of the glass substrate 101. In this embodiment, one of the edges of the inclined surface 108a is arranged to positionally agree with the corresponding edge of the perpendicular surface 101b of the glass substrate 101.

With this arrangement, since the periphery of the encapsulation material 108 is not projecting outwardly beyond the outer peripheral surface of the glass substrate 101, the encapsulation material 108 is protected against any external force that may be inadvertently applied thereto. Additionally, since the outer peripheral surface of the encapsulation material 108 is not inclined, it is less subjected to external force.

In this embodiment, the terminal end of the inclined surface 108a of the encapsulation material 108 may be positioned inwardly relative to the perpendicular surface 101b of the glass substrate 101.

Figure 4:
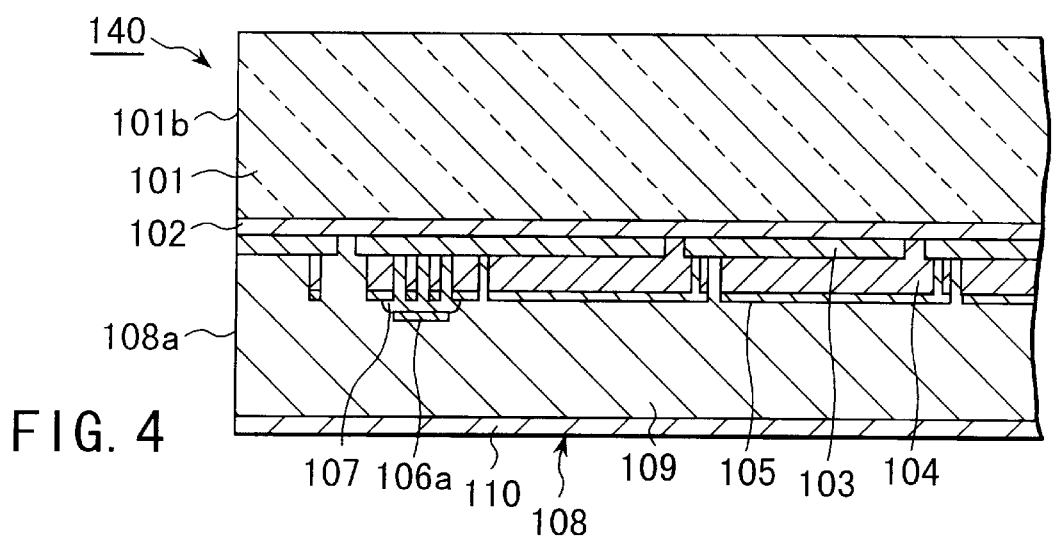
FIG. 4 is a schematic cross sectional view of the fourth embodiment of photovoltaic module according to the invention, showing only a part thereof.

FIG. 4 is a schematic cross sectional view of the fourth embodiment of photovoltaic module 140 according to the invention. The glass substrate 101 of the photovoltaic module 140 of this embodiment is not chamfered at an edge thereof and has a perpendicular surface 101b. Nor the outer peripheral surface of the encapsulation 108 is not chamfered and has a perpendicular surface 108b. Then, the perpendicular surface 108b of the encapsulation material 108 is unified with the perpendicular surface 101b of the glass substrate 101.

With this arrangement, since the periphery of the encapsulation material 108 is not projecting outwardly beyond the periphery of the glass substrate 101, the encapsulation material 108 is less subjected to external force that may be inadvertently applied thereto so that it is protected against damages and accidents that may separate it from the glass substrate.

In this fourth embodiment, the perpendicular surface 108b of the encapsulation material 108 may be positioned inwardly relative to the perpendicular surface 101b of the glass substrate 101.

In view of the fact that the encapsulation material 108 can thermally contract when it is thermally bonded to the glass substrate 101 under pressure, the inclined surface 108a or the perpendicular surface 108b, whichever appropriate, of the encapsulation material 108 of each of the second through fourth embodiments is preferably formed after thermally bonding the encapsulation material 108b to the glass substrate 101 under pressure.

Figure 5:
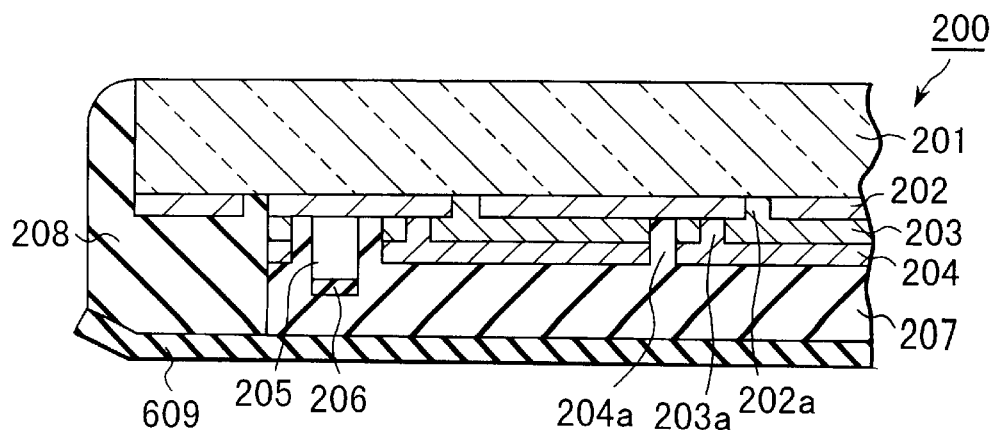
FIG. 5 is a schematic cross sectional view of the fifth embodiment of photovoltaic module according to the invention, showing only a peripheral part thereof.

FIG. 5 is a schematic cross sectional view of the fifth embodiment of photovoltaic module 200 according to the invention. Note, however, that the arrangement of this embodiment may be applied to any of the above described first through fourth embodiments.

A transparent electrode layer 202 of $SiO_2$ is formed on a glass substrate 201 of soda lime glass having dimensions of 92 cm (length)×46 cm (width)×4 mm (height). The transparent electrode layer 202 is scribed along scribe lines 202a that correspond to a plurality of unit cells and divided into strings having a width of about 10 mm. An amorphous silicon type semiconductor photoelectric conversion layer 203 having pin junctions is formed on the transparent electrode layer 202.

The semiconductor photoelectric conversion layer 203 is scribed along scribe lines 103a that is displaced from the corresponding respective scribe lines 202a of the transparent electrode layer 202 by about 100 μm. The scribe lines 203a provides so many connection openings between the transparent electrode layer 203 and a rear electrode layer 204 formed on the semiconductor photoelectric conversion layer 203 by laying ZnO and Ag into a multilayer structure. The rear electrode layer 204 and the semiconductor photoelectric conversion layer 203 arranged at the front surface side relative to the former are divided respectively into strings by scribe lines 203a, 204a, the scribe lines 204a of the rear electrode layer 204 being displayed from the corresponding respective scribe lines 203a of the semiconductor photoelectric conversion layer 203 by about 100 μm. Then, the plurality of unit cells (with a string width of about 10 mm) are connected in series to produce an integrated module of thin film photovoltaic cells.

The semiconductor photoelectric conversion layer and the rear electrode layer are removed from the glass substrate 201 along a line drawn along the outer periphery of the glass substrate 201 and separated from the latter by 5 mm to produce an insulation/separation zone there in order to electrically isolate the photovoltaic cells from the outside along the entire periphery of the glass substrate 201. The portions of the semiconductor photoelectric conversion layer and the rear electrode layer located outside relative to the outermost strings are removed to produce about 3.5 mm wide wiring zones. Solder 205 is applied to the wiring zones to produce bus bar electrodes 206. Thus, the bus bar electrodes 206 are arranged in parallel with the strings of photovoltaic cells. Then, the bus bar electrodes 206 are connected to respective conductive tapes (not shown).

Figure 6:
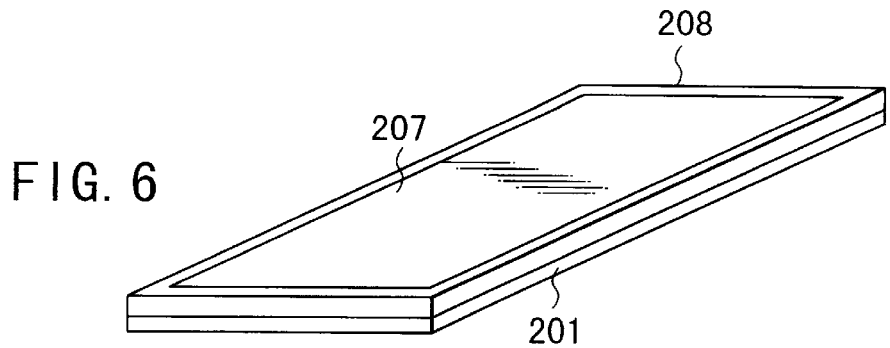
FIG. 6 is a schematic perspective view of the fifth embodiment of photovoltaic module, showing the main encapsulation material and the steam barrier material arranged on the rear surface of the module.

Then, as seen from the perspective view of FIG. 6, a principal encapsulation material 207 of an EVA sheet is laid on a central area of the rear surfaces of the photovoltaic cells and polyisobutylene type resin is applied thereto to produce a steam-barrier member 208 that covers a peripheral area of the rear surfaces of the photovoltaic cells. More specifically, the material of the steam-barrier member 208 is applied to a zonal area having a width of less than 5 mm from the outer periphery of the glass substrate 201 so that the material of the steam-barrier member 208 does not contact the bus bar electrodes 206 and the rear electrode layer 204 in the generation area. Additionally, a rear surface cover film 209 of vinylfluoride resin/Al/vinylfluoride resin is laid on the encapsulation material comprising the principal encapsulation material 207 and the steam-barrier member 208 and the assembly of films is sealed by means of a vacuum laminator. The vacuum laminator is operated at 150° C. for 30 minutes for the thermal curing process. With the above conditions, the materials of the principal encapsulation material and that of the steam-barrier member are bridged and cured. Because the polyisobutylene type resin is mobilized during this process, the lateral surfaces of the glass substrate 201 are also covered by the steam-barrier member 208. The principal encapsulation material 207 and the steam-barrier member 208 shows a thickness of about 0.6 mm, while the rear surface cover film 209 has a thickness of 110 μm.

In an experiment, the current-voltage characteristics of the photovoltaic module prepared in this way was observed by means of a solar simulator with 100 mW/cm$^2$ and AM1.5 to obtain an output level of 32 W from the photovoltaic module. Then, the photovoltaic module was observed in a PCT (pressure cooker test) conducted at 120° C. under 2 atmospheres and the appearance of the photovoltaic module was checked after the test to find the rear electrode totally unaffected and remaining free from corrosion.

For the purpose of comparison, a photovoltaic module was prepared same as the above embodiment except that only EVA was used as the encapsulation material for covering the entire rear surfaces of the photovoltaic cells. The specimen for comparison was also observed by means of the solar simulator to obtain an output level of 32 W same as the fifth embodiment. However, when the specimen was observed in a PCT (pressure cooker test) conducted at 120° C. under 2 atmospheres and the appearance of the photovoltaic module was checked after the test, it was found that rear electrode had been corroded obviously due to the moisture penetrating into it through the periphery thereof. A encapsulation sheet of thermosetting resin such as EVA has advantages that it shows a reflectivity close to glass and can be manufactured at low cost. However, EVA is not satisfactory in terms of water-resistance, moisture-resistance and alkali-resistance. Therefore, moisture can easily penetrate into conventional photovoltaic modules through the exposed EVA to corrode the conductive tapes and the rear electrode layer arranged in the inside and consequently degrade the long-term reliability of the module.

As described above, the fifth embodiment of photovoltaic module 200 according to the invention provides an excellent advantage of long term reliability because of the anti-corrosion effect obtained by using a encapsulation material comprising a principal encapsulation material covering a central area of the rear surfaces of the photovoltaic cells and a steam-barrier member covering a peripheral area of the rear surfaces of the photovoltaic cells so that any moisture trying to penetrate into the inside of the photovoltaic module through the lateral sides of the encapsulation material to corrode the conductive taps and the rear electrode layer in the inside can effectively be prevented from entering. Additionally, such a photovoltaic module can be manufactured at low cost.

Still additionally, since the polyisoprene type resin material of the steam-barrier is applied only to a peripheral area of the rear surface of the assembled photovoltaic cells, the operation of applying the material is easy. Furthermore, with such an arrangement, the rate of consumption of a relatively costly material is low and hence the cost of manufacturing such a photovoltaic module can be held low. Finally, since the principal encapsulation material and the steam-barrier can be made to show a same thickness, the rear surface of the photovoltaic module can be made very flat.

A material showing a steam permeability of 1 g/m$^2$·day per film thickness of 100 μm is preferably used for the steam-barrier. While materials that can be used for the steam-barrier and meet the above requirement include polyisobutylene type resin materials, urethane type isobutylene resin materials, silicon type isobutylene resin materials, urethane type adhesives, acrylate type adhesives and epoxy type adhesives, of which the use of a polyisobutylene type resin material is preferable from the viewpoint of insulation effect and strength.

Various known techniques can be used for curing the above compositions. As for curing polyisobutylene type resin materials, for instance, a technique as disclosed in Japanese Patent Application Laid-Open No. 6-49365 for polymerizing and curing a composition containing an isobutylene type polymer substance having C—C double bonds at terminals, a curing agent having two or more than two hydrosol radicals and a catalyst and a technique for polymerizing a composition containing a isobutylene type polymer substance having hydroxyl radicals at terminals, an isocyanate compound and a curing catalyst may be used.

For the purpose of the present invention, some other additive such as a plasticizer for regulating the viscosity of the composition to be cured may also be added to the composition. A steam-barrier member of an elastic cured material can be formed by curing a composition containing such substances.

Figure 7:
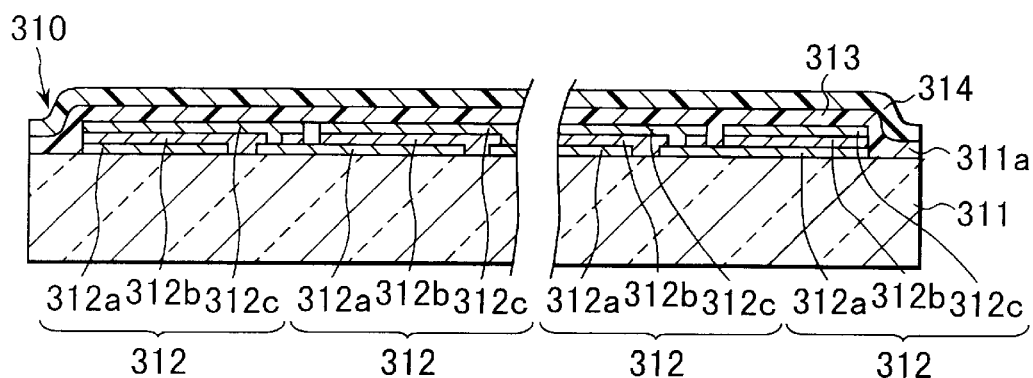
FIG. 7 is a schematic cross sectional view of the sixth embodiment of photovoltaic module according to the invention, illustrating a method of manufacturing a photovoltaic module according to the invention.
Figure 8:
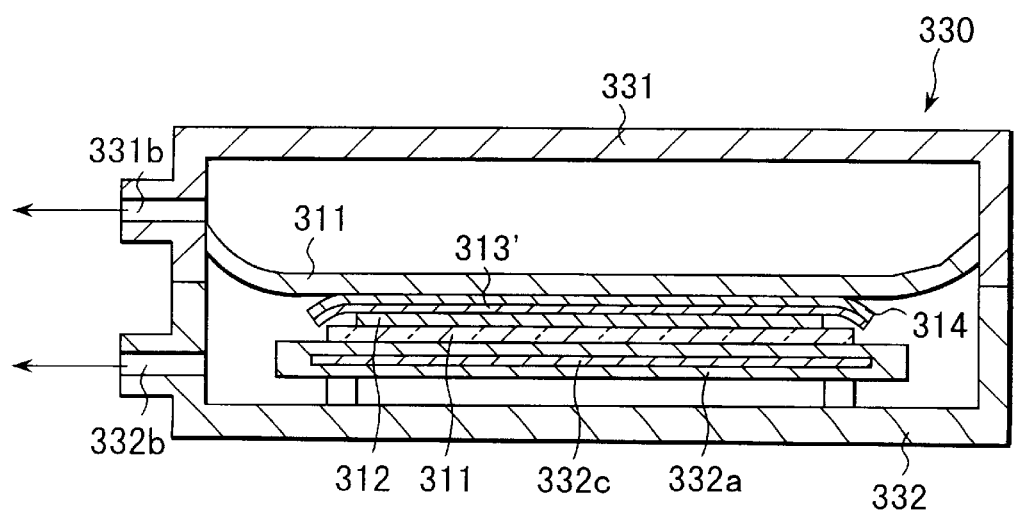
FIG. 8 is a schematic cross sectional view of the sixth embodiment of photovoltaic module according to the invention and placed in a vacuum laminating apparatus, illustrating the heat-bonding step of the method of manufacturing it.
Figure 9:
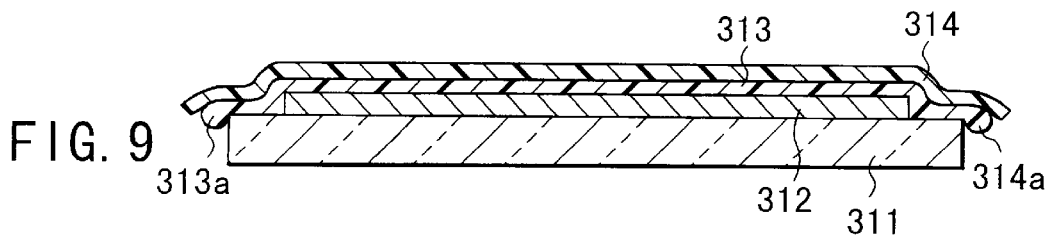
FIG. 9 is a schematic cross sectional view of the sixth embodiment of photovoltaic module according to the invention, illustrating the laminate immediately before the trimming step of the method of manufacturing it.
Figure 10:
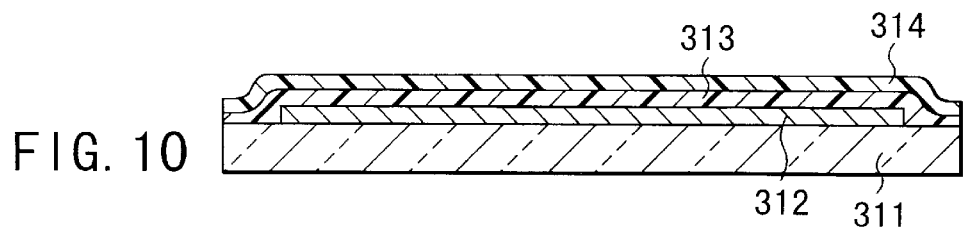
FIG. 10 is a schematic cross sectional view of the sixth embodiment of photovoltaic module according to the invention, illustrating the laminate trimmed in the trimming step.

FIG. 7 is a schematic cross sectional view of the sixth embodiment of photovoltaic 310 module according to the invention, showing a principal portion thereof to illustrating a method of manufacturing a photovoltaic module according to the invention. FIGS. 8 through 10 are schematic cross sectional views of the sixth embodiment of photovoltaic module according to the invention, illustrating different steps of the method of manufacturing it. The method as described hereinafter for this embodiment can also be applied to the first through fourth embodiments of photovoltaic module as described above.

The photovoltaic module 310 shown in FIG. 7 comprises a photovoltaic sub-module, which by turn comprises a plurality of photovoltaic cells 312 integrally formed on a light-transmitting (transparent) glass substrate 311. Sun light is made to enter the photovoltaic sub-module by way of the glass substrate 311. Each unit cell 312 comprises a transparent front electrode layer 312a, a non-single crystal silicon type photoelectric conversion unit 312b and a rear electrode layer 312c sequentially laid on the glass substrate 311 in the above listed order.

The transparent front electrode layer 312a formed directly on the glass substrate 311 may be a layer of a transparent conductive oxide film such as ITO film, $SiO_2$ film or a ZnO film. The transparent front electrode layer 312a may be of a single layer structure or a multilayer structure and can be formed by means of an appropriate known technique such as evaporation, CVD or sputtering. Preferably, the surface of the transparent front electrode layer shows a surface texture structure having micro-undulations. By making the surface of the transparent front electrode layer 312 show such a texture structure, any beams of sun light striking the non-single crystal silicon type photoelectric conversion unit 312b and leaving the cell 312 without contributing to the photoelectric conversion process can be suppressed.

Although riot shown, normally, the non-single crystal silicon type photoelectric conversion unit 312b formed on the transparent front electrode layer 312a has a multilayer structure obtained by sequentially laying a p-type non-single crystal silicon semiconductor layer, a non-single crystal silicon thin film photoelectric conversion layer and an n-type non-single crystal silicon semiconductor layer. All the above listed p-type semiconductor layer, the photoelectric conversion layer 342 and the n-type semiconductor layer can be formed by plasma CVD. The p-type silicon semiconductor layer can be formed by using silicon, silicon carbide or a silicon alloy such as silicon germanium, which is doped with p-conductivity type determinant impurity atoms such as boron atoms or aluminum atoms. Materials that can be used for the layer include silicon (silicon hydride, etc.) that is an intrinsic semiconductor, silicon carbide and silicon alloys such as silicon germanium. Additionally, a slightly doped p-type or n-type semiconductor material containing silicon and a trace of conductivity type determinant impurity may also be used if it satisfactorily operates for photoelectric conversion. The photoelectric conversion layer is made to show a thickness between 0.1 and 10 $\mu$m when it is made of an amorphous material. The n-type silicon-containing semiconductor layer formed on the photoelectric conversion layer may be made of silicon, silicon carbide or a silicon alloy such as silicon germanium, which is doped with n-conductivity type determinant impurity atoms such as phosphor atoms or nitrogen atoms.

While the rear electrode layer 312c formed on the photoelectric conversion unit 312b is made of a metal material, it is advantageous that the rear electrode layer 312c operates not only as electrode but also as reflection layer for reflecting the beams of light entering the photoelectric conversion unit 312b through the glass substrate 311 and getting to the rear electrode layer 312c so as to make them reenter the photoelectric conversion unit 312b. Therefore, it is preferably made of a metal material showing a high reflectivity for light such as silver or a silver alloy. The rear electrode layer 312c can be formed by means of a known technique such as evaporation or sputtering.

The transparent front electrode layer 312a, the non-single crystal silicon type photoelectric conversion unit 312b and the rear electrode layer 312c are formed on the glass substrate 311 as so many thin films having a large surface area and then divided into a plurality of unit cells 312 typically by means of a laser process, which unit cells 312 are then electrically connected in series or in parallel to produce an integrated structure.

As shown in FIG. 7, the transparent front electrode layer and the other silicon thin film layers formed on the glass substrate 311 are removed from a peripheral area 311a thereof typically by means of a sand blast technique so that the peripheral area 311a is exposed to the atmosphere in order to produce cells 312. The exposed glass surface of the peripheral area of the glass substrate 311 provides an enhanced adhesive effect relative to the encapsulation resin to be applied thereto as will be discussed in greater detail hereinafter.

The rear surface of the above described photovoltaic sub-module is then protected and sealed by means of a protection film 314 formed thereon with a encapsulation resin layer (adhesive layer) 313 interposed therebetween. The encapsulation resin is apt to be cured when it is softened and molten by heat and can be used to hermetically seal the unit cells formed on the glass substrate 311 and cause the protection film 314 to be firmly bonded to the photovoltaic sub-module. Resin materials that can be used as encapsulation resin are typically thermoplastic resin materials such as EVA, EVAT, PVB (polyvinylbutylal) and PIB, of which EVA may preferably be used for the purpose of the invention from the viewpoint of adhesion relative to the glass substrate and cost.

The above listed thermoplastic resin materials contain a curing agent (bridging agent) for bridging and curing the resin. Curing agents that can preferably be used for the purpose of the invention include organic peroxide compounds such as 2,5-dimethylhexane-2,5-dihydroperoxide. A bridging agent of an organic peroxide compound can produce radicals to bridge the encapsulation resin when heated above 100° C.

The protection film 314 is used to protect the photovoltaic sub-module when it is placed outdoor so that desirably it is highly moisture-resistant, water-resistant and has a highly insulating effect. Such a protection film 314 may well have an organic film layer of fluorine resin film such as polyvinyl fluoride film (e.g., Tedler Film (trade name)) or polyethyleneterephthalate (PET) film arranged at the side held in contact with the encapsulation resin layer 313. The organic film layer may be of a single layer structure or of a multilayer structure. Alternatively, the protection film layer 314 may have a structure where a metal foil such as aluminum foil is sandwiched by a pair of organic films. Since a metal foil such as aluminum foil can enhance the moisture-resistance and the water-resistance of the protection film, it can effectively protect the photovoltaic sub-module against moisture trying to enter it from the rear surface when the protection film 314 has such a structure. The organic films are preferably fluorine resin films for the purpose of the present invention.

The encapsulation resin layer 313 and the protection film 314 are trimmed along the periphery of the glass substrate 311.

Now, the first through fourth modes of carrying out a method of manufacturing a photovoltaic module according to the invention will be described by referring to FIGS. 8 through 10. Briefly, a photovoltaic module is manufactured by sequentially laying a sheet of encapsulation resin that is apt to be cured when it is softened and molten by heat and a protection film having an area greater than the surface area of the glass substrate on the rear surface of the photovoltaic sub-module and completing a curing process after softening and melting the encapsulation resin so as to securely bond the protection film onto the rear surface of the photovoltaic sub-module. Then, the photovoltaic module is subjected to a predetermined trimming process in an appropriate manufacturing step to produce a finished photovoltaic module product.

Normally, both the sheet of encapsulation resin and the protection film are placed in a vacuum heat-bonding apparatus (so-called vacuum laminating apparatus) along with the photovoltaic sub-module in order to soften and melt the encapsulation resin and heated and bonded together while they are being heated in vacuum.

Any known double vacuum type laminating apparatus can be used for the purpose of the invention. The vacuum laminating apparatus 330 as shown in FIG. 8 as an example comprises a lower chamber 332 and an upper chamber 331 that can be driven to become open and closed relative to the lower chamber 332 by means of a drive mechanism (not shown).

The upper chamber 331 is provided with a diaphragm 331a having its periphery air tightly bonded to the inner peripheral wall of the upper chamber 331. The upper chamber 331 is additionally provided at a lateral wall thereof with an upper exhaust hole 331b held in communication with the internal space defined and isolated by the diaphragm 331a. The upper exhaust hole 331b is linked to an exhaust suction pump (not shown). On the other hand, the lower chamber 332 is provided in the insider thereof with a table 332a for supporting an object of lamination, said table 332a containing a heater 332c for heating the object of lamination. Additionally, the lower chamber 332 is provided at a lateral wall thereof with a lower exhaust hole 332b that is linked to an exhaust pump (not shown).

When encapsulation the photovoltaic sub-module 320 comprising a glass substrate 311 and a plurality of cells 312 integrally formed on the glass substrate 311, firstly the photovoltaic sub-module 320 is placed on the table 332a in the lower chamber 332 with the glass substrate 311 held in contact with the table 332a. Then, the encapsulation resin sheet 313' is placed on the rear surface (the upper surface in FIG. 8) of the photovoltaic sub-module 320 and then the protection film 314 is placed on the encapsulation resin sheet 313' to produce a laminate. Note that the encapsulation resin sheet 313' is as large as or slightly larger than the glass substrate 311 and the protection film 314 is slightly larger than the glass substrate 311.

Thereafter, the upper chamber 331 is closed relative to the lower chamber 332 and both the inside of the upper chamber 331 and that of the lower chamber 332 are evacuated to remove the gas contained in the encapsulation resin sheet 313'. Then, the internal pressure of the upper chamber 331 is restored. As a result, the diaphragm 331a arranged in the upper chamber 331 is expanded downwardly as shown in FIG. 8 to press down the object of lamination placed on the table 332a that is heated by the heater 332c. Then, the object of lamination is heated and held under pressure between the table 332a and the diaphragm 331a until the encapsulation resin sheet 313' becomes softened and molten to consequently produce a laminate where the protection film 314 and the rear surface of the photovoltaic sub-module 320 are firmly bonded together.

In this first mode of carrying out the invention for the sixth embodiment, the heating/bonding process continues until the encapsulation resin is completely cured in the vacuum laminating apparatus. More specifically, in the first mode of carrying out the invention, the heating/bonding process is conducted at temperature higher than the curing temperature of the encapsulation resin and lower than the decomposition temperature of the encapsulation resin. For instance, an EVA encapsulation resin material containing an ordinary organic peroxide compound can be heated/bonded at temperature higher than about 120° C. and lower than 170° C. for about 5 to 120 minutes. After completely curing the encapsulation resin, the produced laminate (photovoltaic module) is taken out from the vacuum laminating apparatus 330.

When taking out the laminate product from the vacuum laminating apparatus 330, firstly the internal pressure of the lower chamber 332 is restored to cause the diaphragm 331a that has been expanded downwardly to contract and restore the original profile and raise the ceiling of the upper chamber 331. Then, the vacuum laminating apparatus 330 is opened to make the laminate product ready to be taken out.

Now, the trimming process will be described. As pointed out above, the laminate product taken out from the vacuum laminating apparatus 330 after the completion of the process of curing the encapsulation resin shows a profile as illustrated in FIG. 9, where the encapsulation resin is partly extending beyond the periphery of the glass substrate 311 because the encapsulation resin was molten to flow when it was heated under pressure. More specifically, it has a molten and extended part 313a that is located under the corresponding extended part 314a of the protection film that is also extending beyond the periphery of the glass substrate 311.

Thus, the molten and extended part 313a of the encapsulation resin is subjected to a trimming process along with the corresponding extended part 314a of the protection film 314 in a condition where the extended part 313a of the encapsulation resin is heated to temperature higher than the softening point (and lower than the decomposition temperature) of the encapsulation resin. While the specific temperature of the trimming process may vary depending on the encapsulation resin that is actually used, it is between 40° C. and 150° C. when the encapsulation resin is made of ordinary EVA. An ordinary cutting device such as cutter may be used for the trimming process. Normally, the encapsulation resin and the protection film 313 are cut along the periphery of the glass substrate 311.

In the trimming process, the entire laminate product may be heated above the softening point of the encapsulation resin. Alternatively, the trimming process may be conducted while placing the laminate product on a hot plate with the glass substrate facing downward and heating the laminate above the softening point of the encapsulation resin. Still alternatively, the trimming process may be conducted by means of a cutting device such as cutter that is heated the laminate above the softening point of the encapsulation resin. In this instance again, the extended part 313*a* is brought into contact with a cutting device heated to predetermined temperature so that the extended part 313*a* is heated above the softening point of the encapsulation resin.

Preferably, the trimming process is conducted after the completion of the operation of curing the encapsulation resin because the encapsulation resin can be trimmed by means of a cutting device more easily after completely curing the encapsulation rein than before the completion of the curing process.

In the second mode of carrying out the invention for the sixth embodiment of the invention, the heating/bonding process in the vacuum laminating apparatus 330 is terminated while the encapsulation resin is being cured, that is, after the start of the process of curing the encapsulation resin and before the completion of the process. In other words, the laminate is taken out of the vacuum laminating apparatus when the encapsulation resin sheet 313' has already begun to be softened and molten to become cured by the heating/bonding operation but it is still not completely cured. While the conditions in which the heating/bonding operation is conducted may be selected appropriately depending on the curing characteristics of the encapsulation resin to be used, the operation is normally conducted at temperature between 120° C. and 130° C. for about 5 to 10 minutes when the encapsulation resin is ordinary EVA containing an organic peroxide compound.

The laminate taken out of the vacuum laminating apparatus 330 when the encapsulation resin is still not completely cured (the laminate may be referred to as intermediary photovoltaic module product because the curing process is not completed yet) is then moved into an ordinary reheating apparatus (not shown) such as an oven and heated there to complete the process of curing the encapsulation resin. While the conditions in which the curing operation is conducted may be selected appropriately depending on the type of the encapsulation resin to be used, the operation is normally conducted at temperature above 140° C. (and lower than the decomposition temperature of the encapsulation resin) for 10 to 120 minutes in the case where the encapsulation resin is ordinary EVA. While the encapsulation resin may contract as it is cured in this heating process, the extent of contraction is small and negligible.

Then, the trimming process is carried out on the photovoltaic module taken out of the reheating apparatus after the completion of the process of curing the encapsulation resin and will be completed before the encapsulation resin is cooled below its softening point.

With the above described mode of carrying out the invention, the object of lamination does not occupy the vacuum laminating apparatus until the completion of the process of curing the encapsulation resin so that it provides an advantage of improving the productivity of the manufacturing photovoltaic modules.

In the third mode of carrying out the invention for the sixth embodiment of the invention, as in the above described second mode, the heating/bonding process in the vacuum laminating apparatus 330 is terminated while the encapsulation resin is being cured, that is, after the start of the process of curing the encapsulation resin and before the completion of the process. Then, the obtained intermediary photovoltaic module product is taken out of the vacuum laminating apparatus.

The laminate product taken out of vacuum laminating apparatus 330 shows a profile as illustrated in FIG. 9, where the encapsulation resin is partly extending beyond the periphery of the glass substrate 311 because the encapsulation resin was molten to flow when it was heated under pressure. Thus, it has an extended part 313*a*. Thus, the molten and extended part 313*a* of the encapsulation resin is subjected to a trimming process along with the corresponding extended part 314*a* of the protection film 314 (see FIG. 10). Typically a cutter may be used to cut the extended parts along the periphery of the glass substrate 3111 for the trimming operation.

Then, the work having a profile as shown in FIG. 10 is put into an ordinary reheating apparatus such as an oven and heated there to complete the process of curing the encapsulation resin. While the conditions in which the curing operation is conducted may be selected appropriately depending on the type of the encapsulation resin to be used, the operation is normally conducted at temperature above 140° C. (and lower than the decomposition temperature of the encapsulation resin) for 10 to 120 minutes in the case where the encapsulation resin is ordinary EVA. While the encapsulation resin may contract as it is cured in this heating process, the extent of contraction is small and negligible.

In the above described third mode of carrying out the invention, there is no risk for the extended part 313*a* to come off and contaminate the reheating apparatus during the reheating process for curing the encapsulation resin where the work is reheated in the reheating apparatus because all the unnecessary parts of the encapsulation resin and the protection film are removed by trimming prior to the reheating process (see FIG. 9). Thus, a photovoltaic module 310 as shown in FIG. 7 is manufactured.

With the method of manufacturing a photovoltaic module as described above in terms of the sixth embodiment of the invention, both the extended part 314*a* of the protection film and the extended part 313*a* of the encapsulation resin can be removed smoothly and efficiently in the trimming process without, if partly, separating the protection film from the remaining part of the module and/or damaging the glass substrate 311, the protection film 314 and/or the encapsulation resin because the encapsulation resin layer is not subjected to excessive stress during the trimming process. As a result, a laminate in which the end face of the encapsulation resin layer 313 and that of the protection film 314 are flush with the end face of the glass substrate 311 can be obtained as shown in FIG. 10 to finally produce a finished photovoltaic module product 310 as shown in FIG. 7.

According to the invention, the cost of manufacturing a photovoltaic module can be reduced because it is no longer necessary to carry out the heating/pressurizing process and the process of softening/melting and curing the encapsulation resin continuously in a costly vacuum laminating apparatus. Additionally, the molten and extended part of the encapsulation resin can be easily removed along with the unnecessary part of the protection film in the trimming process to consequently raise the productivity and the yield of manufacturing photovoltaic modules.

Figure 11:
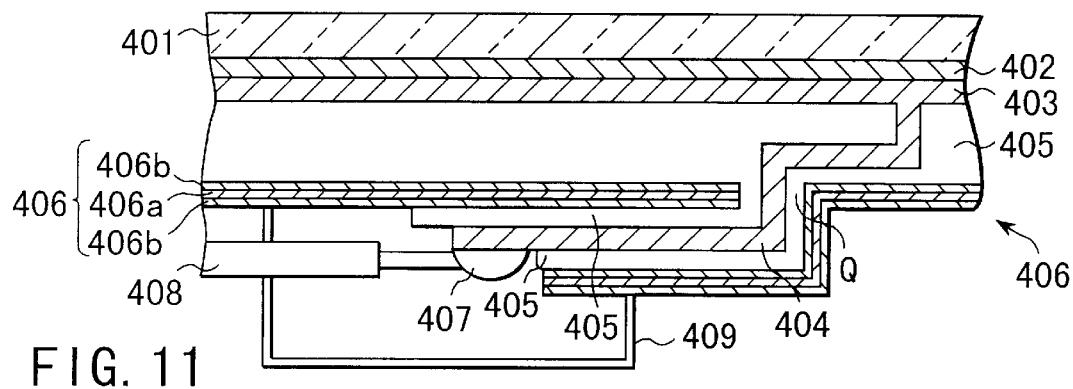
FIG. 11 is a schematic cross sectional view of the seventh embodiment of photovoltaic module according to the invention, which is of the thin film type.

FIG. 11 is a schematic cross sectional view of the seventh embodiment of photovoltaic module 400 according to the invention, which is a thin film type photovoltaic module. Note, however, that the following description is mostly also applicable to the above described first through fourth embodiments. Referring to FIG. 11, a plurality of thin film type photovoltaic cells 402 are arranged on the rear surface of front glass cover 401 operating as transparent substrate and connected in series and/or in parallel by a rear surface electrode 403. The rear surface electrode 403 is by turn connected to an output lead-out wire 404, which is typically made of metal foil.

The above listed rear surface side components are sealed by means of a filling material layer 405 with the output lead-out wire 404 drawn out therefrom. The filling material is normally selected from EVA, PVB and silicon resin.

Then, the rear surface of the filling material layer 405 is covered by rear surface encapsulation materials 406 having a three-layered structure obtained by sandwiching a metal foil 406a with a pair of insulating films 406b of a highly moisture-resistant and water-resistant material such as fluorine type films or ET films. The gap between the two rear surface encapsulation materials 406 provides an output lead-out section Q for leading out the output lead-out wire 404.

As pointed out above, the rear surface encapsulation material has a three-layered structure obtained by sandwiching a metal foil with a pair of insulating films, although a it may alternatively be made of a single insulating film. When the three-layered structure is used, the metal foil sandwiched by the insulating films operates to enhance the moisture-resistance and the water-resistance of the member so that it can effectively protect the photovoltaic cells from moisture.

The output lead-out wire 404 drawn out through the output lead-out section Q is made to extend along rear surface of the photovoltaic module. More specifically, one of the rear surface encapsulation materials 406 is laid on the filling material layer 405 and the EVA film and the output lead-out wire 404 drawn out through and the output lead-out section Q are laid on the rear surface encapsulation material 406. Then, the EVA film is laid on the extension of the output lead-out section 404 and the other rear surface encapsulation material 406 are laid on the EVA film. The rear surface side multilayer structure becomes complete when the layers are treated typically in a hot melt process. The length along which the outer rear surface encapsulation material 406 is laid on the output lead-out wire 404 (which corresponds to the distance between the atmosphere and the output lead-out section) is preferably 100 mm or more. To be more accurate, the longer the better for the distance. The output lead-out wire 404 drawn to the outside is then secured to terminal 406 by soldering or by means of a screw and an output lead wire 408 is connected to the terminal 407. The terminal section of the module including the output lead-out wire 404, the terminal 407 and the output lead wire 408 is housed in a terminal box 409.

As described above, of the above described photovoltaic module 400, the filling material layer 405 of the output lead-out section Q is covered by the rear surface encapsulation materials 406 and hence not exposed to the atmosphere. Therefore, the filling material layer 405 of the output lead-out section Q is separated from the atmosphere by a distance longer than the counterpart of any known photovoltaic module so that moisture is effectively prevented from penetrating into the inside. Thus, the output lead-out wire 404 and the rear surface electrode 403 are effectively protected against corrosion to improve the weather-resistance of the photovoltaic module. Because of the above advantages, it is no longer necessary to seal the inside of the terminal box 409 with protection resin so that the efficiency of manufacturing the photovoltaic module will be remarkably raised.

Figure 12:
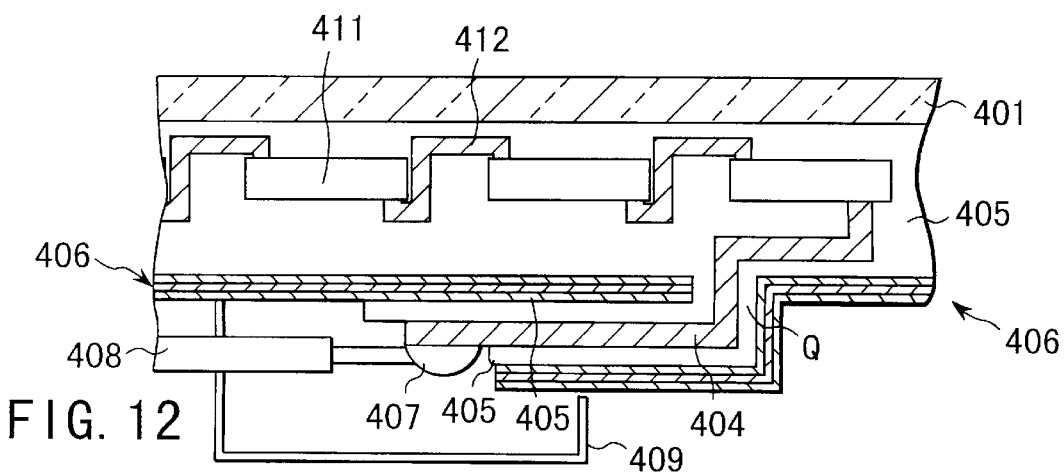
FIG. 12 is a schematic cross sectional view of the eighth embodiment of photovoltaic module according to the invention, which is of the crystal type.

FIG. 12 is a schematic cross sectional view of the eighth embodiment of photovoltaic module according to the invention, which is of the crystal type. In FIG. 12, the components similar to those of FIG. 11 are denoted respectively by the same reference symbols and will not be described any further.

Referring to FIG. 12, a plurality of photovoltaic cells 411 are arranged on the rear surface of the front glass cover 401 and mutually connected by means of connection wires 412. Each of the photovoltaic cells 411 located at the opposite ends are connected to an output lead-out wire 404. Otherwise, the module has a configuration same as shown in FIG. 1.

The photovoltaic module illustrated in FIG. 12 provides the advantages as described above by referring to FIG. 11 so that the rear surface electrode 403 and the connection wires are protected against corrosion to improve the weather-resistance of the module.

Figure 13:
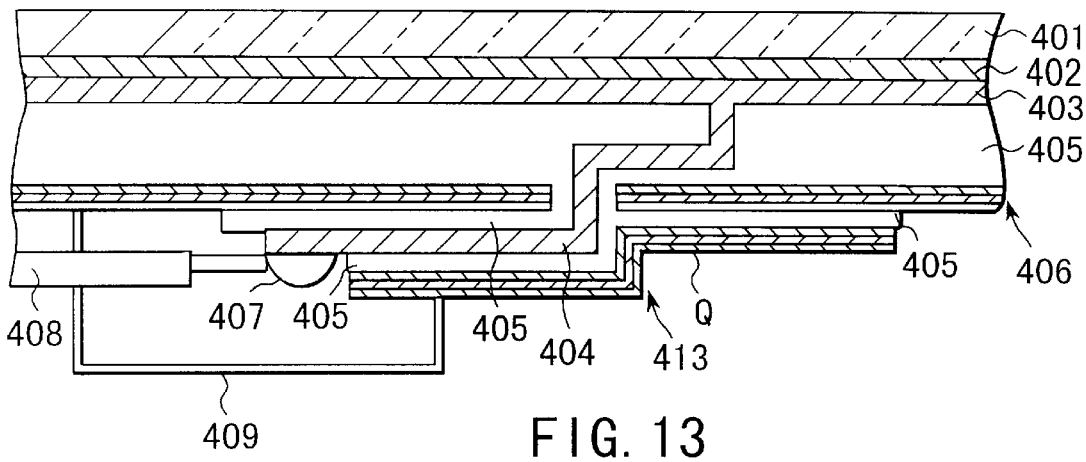
FIG. 13 is a schematic cross sectional view of the ninth embodiment of photovoltaic module according to the invention, which is of the thin film type.
Figure 14:
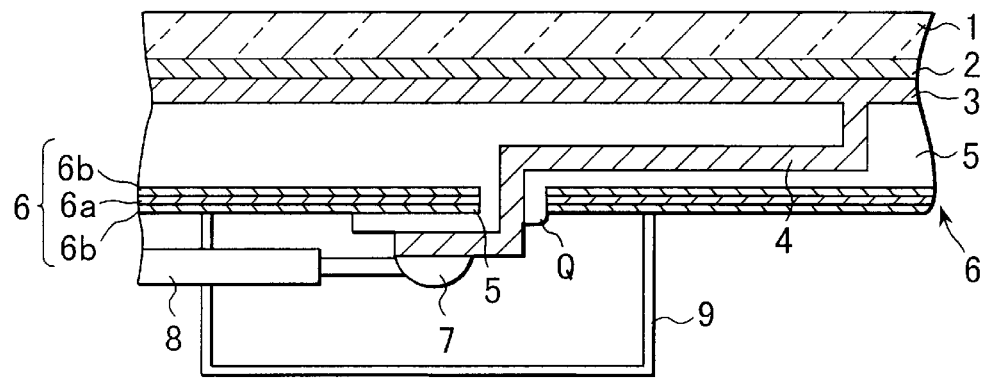
FIG. 14 is a schematic cross sectional view of a known thin film type photovoltaic module.
Figure 15:
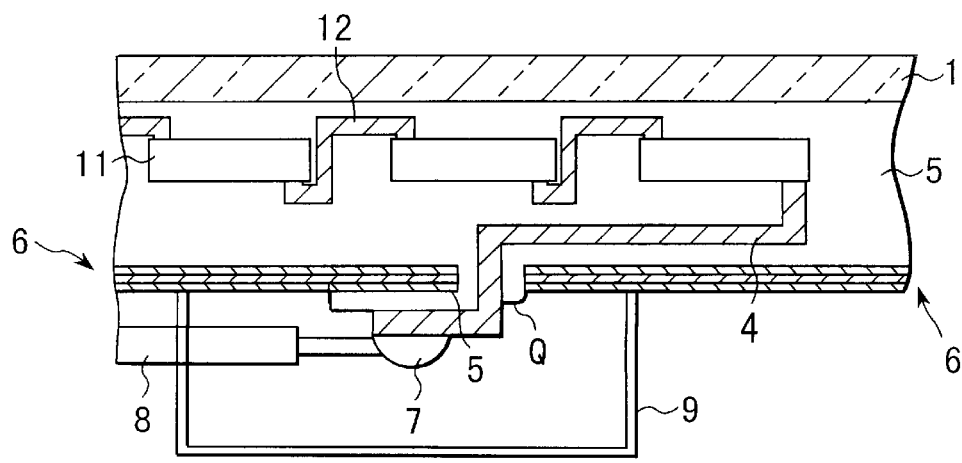
FIG. 15 is a schematic cross sectional view of another known thin film type photovoltaic module.

FIG. 13 is a schematic cross sectional view of the ninth embodiment of photovoltaic module according to the invention, which is also of the thin film type. In FIG. 13, the components similar to those of FIG. 11 are denoted respectively by the same reference symbols and will not be described any further.

Referring to FIG. 13, the arrangement of the photovoltaic cells 402, the rear surface electrode 403 and the filling material layer 405 on the rear surface of the front glass cover 401 is same as that of FIG. 11. In the photovoltaic module of FIG. 13, the rear surface encapsulation materials 406 are provided with a through hole, in which the output lead-out section Q is arranged. Then, the output lead-out wire 404 is drawn out onto the rear surface side of one of the rear surface encapsulation materials 406 and extended by way of the filling material layer 405. A third rear surface encapsulation material 413 is laid on the other rear surface encapsulation material 406 and the extension of the output lead-out wire 404 with the filling material layer 405 interposed therebetween.

The photovoltaic module of FIG. 13 also provides the advantages as described above by referring to FIG. 11 so that the rear surface electrode 403 and the connection wires are protected against corrosion to improve the weather-resistance of the module.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A photovoltaic module comprising a substrate, a semiconductor layer arranged on one of the principal surfaces of the substrate, divided into a plurality of sections and sealed by an encapsulation material, wherein said encapsulation material is arranged on the principal surface of the substrate without its end face projecting outwardly beyond an end face of the substrate, and wherein the end face of the encapsulation material defines a first slope, and the end face of the substrate defines a second slope parallel to the first slope.

2. A photovoltaic module comprising:

a transparent insulating substrate;

photovoltaic cells formed by sequentially laying a transparent electrode layer, a semiconductor photoelectric conversion layer and rear electrode layer; and a sealing member for sealing the rear surface of said photovoltaic cells;

said sealing member including a principal encapsulation material covering a central area of the rear surface of said photovoltaic cells and a steam barrier material different from the principal encapsulation material and covering a peripheral area of the rear surface of said photovoltaic cells, said steam barrier material showing a steam permeability not greater than 1 $g/m^2$ day per film thickness of 100 $\mu$m.

3. Photovoltaic module comprising:

a transparent substrate;

photovoltaic cells formed on a rear surface of said transparent substrate;

an output lead-out wire connected to said photovoltaic cells;

a filling member for sealing said photovoltaic cells; and a rear surface encapsulation material arranged on the rear surface of said filling member;

said output lead-out wire being drawn to the rear surface of said rear surface encapsulation material from the inside of said filling member by way of an output lead-out section, wherein the output lead-out wire has a parallel section extending over a part of the rear surface encapsulation material, and wherein another part of the rear surface encapsulation material extends over the output lead-out section and the parallel section of the output lead-out wire.

4. A method of manufacturing a photovoltaic module comprising:

a step of laying a sheet of encapsulation resin adapted to be softened, molten and cured by heat on the rear surface of a photovoltaic sub-module having a plurality of unit cells tightly arranged on a light-transmitting glass substrate and then laying a protection film having dimensions greater that the glass substrate on the sheet of encapsulation resin;

a step of bonding the protection film to the rear surface of said photovoltaic sub-module by softening, melting and completely curing said encapsulation resin; and a step of cutting off the portion of the encapsulation resin extending from said glass substrate as a result of the melt of said encapsulation resin along with the corresponding portion of the protection film under the condition of keeping the temperature of the extending portion of said encapsulation resin above the softening point of the encapsulation resin.

5. A method of manufacturing a photovoltaic module comprising:

a step of laying a sheet of encapsulation resin adapted to be softened, molten and cured by heat on the rear surface of a photovoltaic sub-module having a plurality of unit cells tightly arranged on a light-transmitting glass substrate and then laying a protection film having dimensions greater than the glass substrate on the sheet of encapsulation resin;

a step of bonding said sheet of encapsulation resin and said protection film to said photovoltaic sub-module under pressure in vacuum, while heating in a vacuum heating/bonding apparatus;

a step of taking said photovoltaic sub-module out of said vacuum heating/bonding apparatus while said encapsulation resin is curing;

a step of cutting off the portion of the encapsulation resign extending from said glass substrate as result of melting in said heating/bonding apparatus along with the corresponding portion of the protection film; and a step of heating and completely curing said encapsulation resin in a separate heating apparatus.

\* \* \* \* \*

Disclaimer

6,288,326 B1—Akimine Hayashi, Kobe (JP); Naoaki Nakanishi, Kobe (JP); Seishiro Mizukami, Kyoto (JP); and Takeharu Yamawaki, Shiga (JP). PHOTOVOLTAIC MODULE. Patent dated September 11, 2001. Disclaimer filed November 9, 2012, by the assignee, Kaneka Corporation.

Hereby disclaims complete claim 2 of said patent.

(*Official Gazette, February 5, 2013*)

(12) EX PARTE REEXAMINATION CERTIFICATE (9615th)

United States Patent
Hayashi et al.

(10) Number: US 6,288,326 C1
(45) Certificate Issued: Apr. 29, 2013

(54) PHOTOVOLTAIC MODULE

(75) Inventors: Akimine Hayashi, Kobe (JP); Naoaki Nakanishi, Kobe (JP); Seishiro Mizukami, Kyoto (JP); Takeharu Yamawaki, Shiga (JP)

(73) Assignee: Kaneka Corporation, Osaka-Shi, Osaka (JP)

Reexamination Request:
No. 90/012,554, Sep. 13, 2012

Reexamination Certificate for:
Patent No.: 6,288,326
Issued: Sep. 11, 2001
Appl. No.: 09/531,545
Filed: Mar. 20, 2000

(30) Foreign Application Priority Data

Mar. 23, 1999 (JP) .................. 11-077910
Aug. 13, 1999 (JP) .................. 11-229211
Aug. 13, 1999 (JP) .................. 11-229213
Nov. 19, 1999 (JP) .................. 11-330138
Nov. 19, 1999 (JP) .................. 11-330140

(51) Int. Cl.
*H01L 31/042* (2006.01)

(52) U.S. Cl.
USPC ............ 136/251; 136/293; 257/433; 438/64; 438/66; 438/90; 438/67; 156/267; 156/300; 156/309.3; 156/309.6; 156/309.9

(58) Field of Classification Search
None
See application file for complete search history.

(56) References Cited

To view the complete listing of prior art documents cited during the proceeding for Reexamination Control Number 90/012,554, please refer to the USPTO's public Patent Application Information Retrieval (PAIR) system under the Display References tab.

*Primary Examiner* — Timothy Speer

(57) ABSTRACT

A photovoltaic module comprises a substrate, a semiconductor layer arranged on one of the principal surfaces of the substrate, divided into a plurality of sections and sealed by a encapsulation material, in that the encapsulation material is arranged on the principal surface of the substrate without its end face projecting outwardly beyond the end face of the substrate.

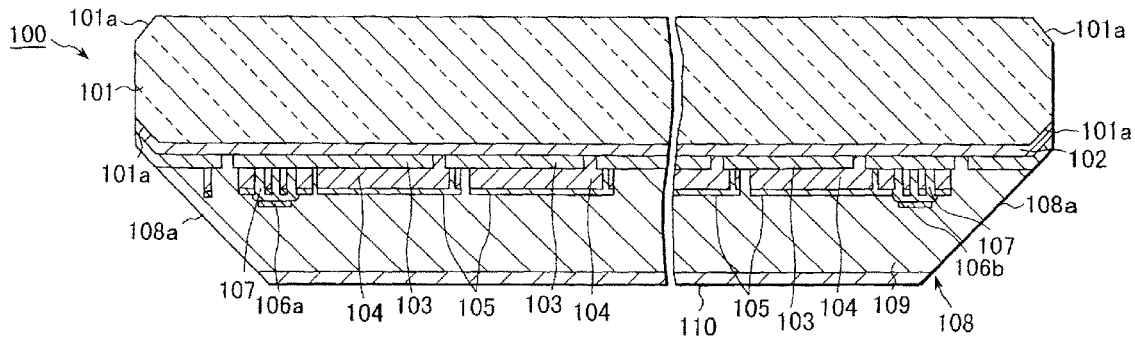

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claim 2 is now disclaimed.

Claims 1 and 3-5 were not reexamined.

\* \* \* \* \*